US011410976B2

(12) United States Patent
Abe

(10) Patent No.: US 11,410,976 B2
(45) Date of Patent: Aug. 9, 2022

(54) DISPLAY DEVICE

(71) Applicant: Japan Display Inc., Minato-ku (JP)

(72) Inventor: Hideaki Abe, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 133 days.

(21) Appl. No.: 16/986,919

(22) Filed: Aug. 6, 2020

(65) Prior Publication Data

US 2021/0057394 A1     Feb. 25, 2021

(30) Foreign Application Priority Data

Aug. 20, 2019 (JP) .............................. JP2019-150417

(51) Int. Cl.

| | |
|---|---|
| *H01L 25/075* | (2006.01) |
| *H01L 33/60* | (2010.01) |
| *F21K 9/68* | (2016.01) |
| *H01L 33/46* | (2010.01) |
| *H01L 33/54* | (2010.01) |
| *H01L 25/16* | (2006.01) |

(52) U.S. Cl.
CPC ............ *H01L 25/0753* (2013.01); *F21K 9/68* (2016.08); *H01L 33/46* (2013.01); *H01L 33/60* (2013.01); *H01L 25/167* (2013.01); *H01L 33/54* (2013.01); *H01L 2933/0058* (2013.01)

(58) Field of Classification Search
CPC ....... F21K 9/68; H01L 33/46; H01L 25/0753; H01L 33/60; H01L 33/54; H01L 2933/0058; H01L 2924/171; H01L 2924/1711; H01L 21/76; G02F 1/133605; G02F 1/133611; G02F 1/133608; G02F 1/133603

See application file for complete search history.

(56) References Cited

U.S. PATENT DOCUMENTS

| | | | | |
|---|---|---|---|---|
| 2006/0221612 | A1* | 10/2006 | Song ................. | G02F 1/133603 362/346 |
| 2016/0372528 | A1* | 12/2016 | Kamura ............. | H01L 51/5284 |
| 2017/0133357 | A1 | 5/2017 | Kuo et al. | |
| 2019/0067533 | A1* | 2/2019 | Chen .................... | H01L 33/508 |

\* cited by examiner

*Primary Examiner* — Feifei Yeung Lopez
(74) *Attorney, Agent, or Firm* — Oblon, McClelland, Maier & Neustadt, L.L.P.

(57) ABSTRACT

A display device includes a substrate, a first pixel region including a first light emitting element group over the substrate, a second pixel region including a second light emitting element group over the substrate and adjacent to the first light emitting element group, and a partition wall between the first light emitting element group and the second light emitting element. A height of the partition wall is larger than heights of a plurality of emitting elements included in each of the first light emitting element group and the second light emitting element group.

14 Claims, 11 Drawing Sheets

10B

10B

10C

10C

10D

10D

10E

10E

DISPLAY DEVICE

CROSS REFERENCE TO RELATED APPLICATIONS

This application is based on and claims the benefit of priority from the prior Japanese Patent Application No. 2019-150417, filed on Aug. 20, 2019, the entire contents of which are incorporated herein by reference.

FIELD

The present invention relates to a display device, in particular, a display device using micro LEDs.

BACKGROUND

For a small-sized or medium-sized display such as a smartphone, a display device using a liquid crystal or an OLED (Organic Light Emitting Diode) has already been commercialized. In particular, an OLED display device using the OLED that is a self-luminous element has advantages that it has high contrast and does not require a backlight, as compared with a liquid crystal display device. However, since the OLED is composed of an organic compound, it is difficult to secure high reliability of the OLED display due to deterioration of the organic compound.

On the other hand, as a next-generation display, a so-called micro LED display device in which pixels are arranged in a matrix and micro LEDs are arranged in each of the pixels has been developed. The micro LED is a self-luminous element similar to the OLED, but unlike the OLED, the micro LED is composed of an inorganic compound containing gallium (Ga), indium (In), or the like. Therefore, compared to the OLED display, the micro LED display can easily secure high reliability. Further, the micro LED has high luminous efficiency and can be made to have high brightness. Therefore, the micro LED display device is expected as the next-generation display having high reliability, high brightness, and high contrast.

Similar to general LEDs, micro LEDs are formed on a substrate such as sapphire, and are separated into individual micro LEDs by dicing the substrate. As described above, in the micro LED display device, the diced micro LEDs are arranged in the pixels of a display substrate.

The micro LED arranged in the pixel emits light not only from a top surface of the micro LED, which corresponds to a display surface of the display device, but also from a side surface of the micro LED. Therefore, in order to improve light extraction efficiency of the micro LED, a method of using light emitted from the side surface of the micro LED is disclosed (for example, US Patent Application Publication Nos. 2017/0133357 and 2019/0067533).

SUMMARY

A display device according to an embodiment of the present invention includes a substrate, a first pixel region including a first light emitting element group over the substrate, a second pixel region including a second light emitting element group over the substrate and adjacent to the first light emitting element group, and a partition wall between the first light emitting element group and the second light emitting element. A height of the partition wall is larger than heights of a plurality of emitting elements included in each of the first light emitting element group and the second light emitting element group.

A display device according to an embodiment of the present invention includes a first pixel region including a first light emitting element group, a second pixel region including a second light emitting element group and adjacent to the first light emitting element group in a first direction, a third pixel region including a third light emitting element group and adjacent to the first light emitting element group in a second direction perpendicular to the first direction, a fourth pixel region including a fourth light emitting element group and adjacent to the second pixel region and the third pixel region, a first partition wall between the first light emitting element group and the second light emitting element group and between the fourth light emitting element group and the second light emitting element group, and a second partition wall between the first light emitting element group and the third light emitting element group and between the third light emitting element group and the third light emitting element group.

DESCRIPTION OF EMBODIMENTS

Figure 1A:
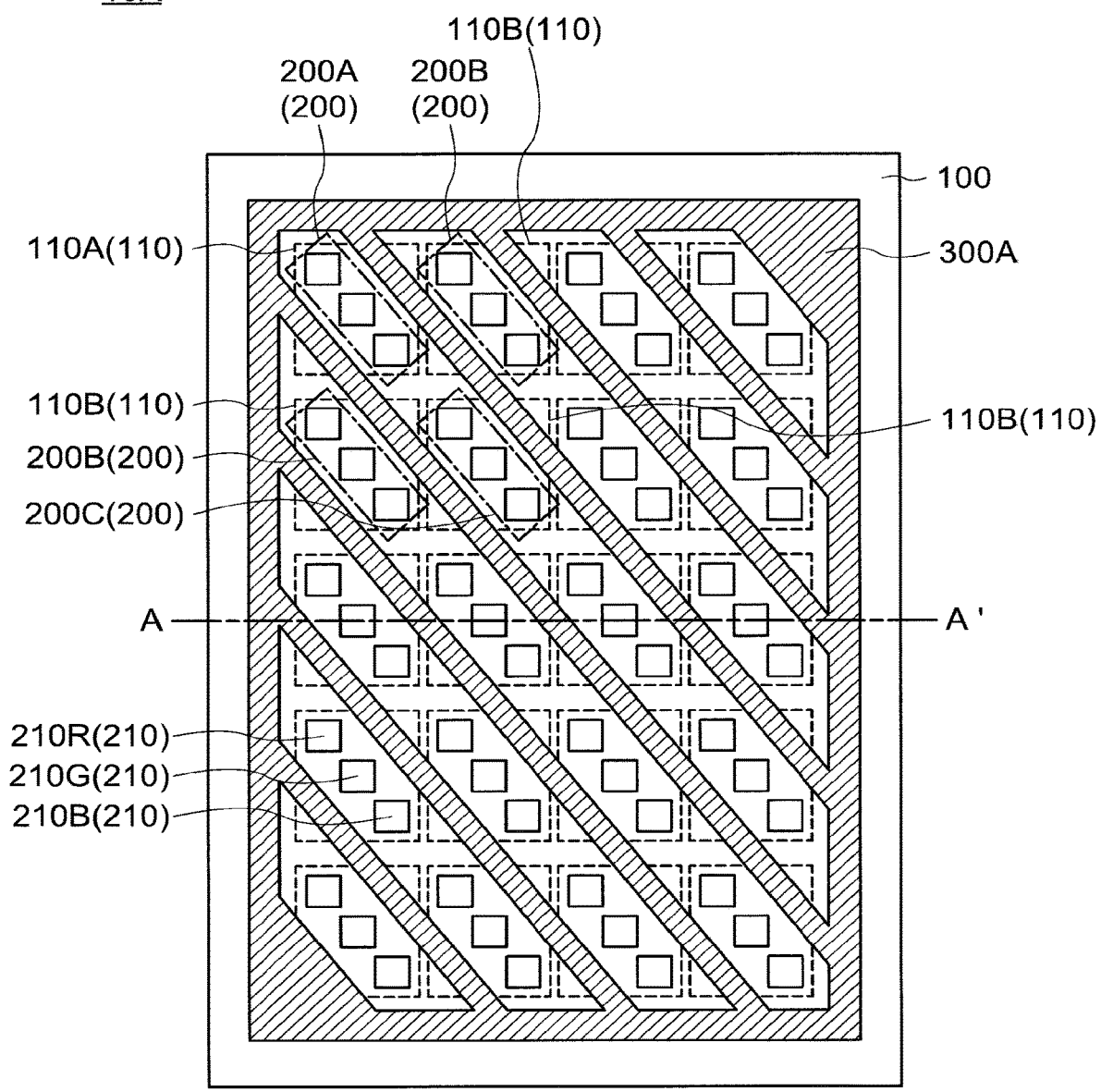
FIG. 1A is a schematic view (a plan view) of a display device according to an embodiment of the present invention.

In a minute light emitting element such as a micro LED, it is desired to further improve light extraction efficiency of a display surface of a display device by using light from a side surface of the light emitting element.

In view of the above problem, it is one object of the present invention to provide a display device including a structure having high light extraction efficiency of a display surface.

Each embodiment of the present invention is explained below while referring to the drawings. However, each embodiment is only an example and a structure easily arrived at by a person skilled in the art by making appropriate modifications without departing from the concept of the invention is naturally to be contained in the scope of the present invention. In addition, the drawings may be illustrated so that the width, thickness, shape, and the like are illustrated more schematically compared with those of the actual modes in order to provide a clearer explanation. However, they are only an example and do not limit the interpretation of the present invention.

In each embodiment of the present invention, for the convenience of explanation, although an explanation is made using the terms "over" or "below", the relationship of up-and-down may be reversed. For example, an expression of "a partition wall over a substrate" merely explains the relationship of up-and-down between the substrate and the partition wall as described above, other members may also be arranged between the substrate and the partition wall. Further, "over" or "below" means the stacking order in a structure in which a plurality of members is stacked, always does not mean that the plurality of members overlaps each other.

In the specification, expressions such as "a includes A, B, or C", "a includes any of A, B, and C", or "a includes one selected from the group consisting of A, B, and C" do not exclude the case that a includes the combinations of A to C unless otherwise specified. These expressions also do not exclude the case that a includes further other elements.

In the specification, "a front surface" refers to a surface from which light is extracted in the display device. Also, "a front view" refers to a view as seen from the front surface.

First Embodiment

Figure 1B:
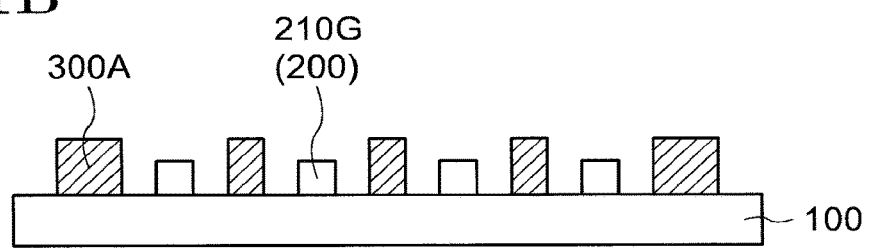
FIG. 1B is a schematic view (a cross-sectional view) of a display device according to an embodiment of the present invention.

Referring to FIGS. 1A and 1B, a display device 10A according to an embodiment of the present invention is described.

Structure

FIGS. 1A and 1B are schematic views of the display device 10A according to an embodiment of the present invention. Specifically, FIG. 1A shows a plan view (a front view) of the display device 10A, and FIG. 1B shows a cross-sectional view of the display device 10A taken along the line A-A' of FIG. 1A.

As shown in FIG. 1A, the display device 10A includes a substrate 100, a light emitting element group 200, and a partition wall 300A. The light emitting element group 200 and the partition wall 300A are provided over the substrate 100.

The substrate 100 includes a plurality of pixel regions 110 arranged in a matrix. In the specification, for convenience, two adjacent pixel regions of the plurality of pixel regions 110 are referred to as a first pixel region 110A and a second pixel region 110B. Further, for convenience, the pixel region located diagonally to the first pixel region 110A and adjacent to the second pixel region 110B is referred to as a third pixel region 110C.

The first light emitting element group 200A is provided in the first pixel region 110A. A second light emitting element group 200B is provided in the second pixel region 110B. The third light emitting element group 200C is provided in the third pixel region 110C. Each of the first light emitting element group 200A, the second light emitting element group 200B, and the third light emitting element group 200C includes a plurality of light emitting elements 210, specifically, a red light emitting element 210R, a green light emitting element 210G, and a blue light emitting element 210B are included. As shown in FIG. 1A, the red light emitting element 210R, the green light emitting element 210G, and the blue light emitting element 210B are arranged on a diagonal line of the pixel region 110.

The pixel region 110 includes an electrode for electrically connecting to the light emitting element 210. The light emitting element 210 and the electrode of the pixel region 110 may be electrically connected to each other through a conductive material such as a conductive paste or an anisotropic conductive film (ACF).

The substrate 100 may include a base material, and may further include a driving element such as a transistor for driving the light emitting element 210 in each of the plurality of pixel regions 110. A silicon semiconductor, an oxide semiconductor such as IGZO, or a compound semiconductor such as GaN can be used for the transistor.

Although not shown, the substrate 100 may include a driver circuit region such as a gate driver circuit or a source driver circuit in addition to the pixel region 110. Further, it may include a terminal area for connecting with an external device. The driver circuit region and the terminal region are preferably provided on an outer peripheral portion of the substrate 100 so as to surround the pixel regions 110 arranged in a matrix.

The light emitting element 210 is, for example, a mini LED or a micro LED, but is not limited to. This embodiment can be applied to any light emitting element 210 that emits light not only from a top surface but also from a side surface. In the specification, the mini LED means an LED having a side length of 100 µm or more, and the micro LED means an LED having a side length of several µm or more and 100 µm or less.

The partition wall 300A includes a frame portion provided on the outer peripheral portion of the substrate 100 so as to surround the plurality of pixel regions 110 arranged in a matrix, and a linear portion provided in a stripe shape in the plurality of pixel regions 110. The linear portion of the partition wall 300A is provided so as to linearly extend between the first light emitting element group 200A and the second light emitting element group 200B and between the second light emitting element group 200B and the third light emitting element group 200C. That is, the partition wall 300A includes the frame portion provided along the outer periphery of the substrate 100, and inside the frame portion, one side (first side) of the frame portion to the other side (second side) orthogonal to one side (first side). In other words, it can be said that the partition 300A includes opening portions where the light emitting element groups 200 are provided. The partition wall 300A is provided apart from the light emitting elements 210 of the first light emitting element group 200A, the light emitting elements 210 of the second light emitting element group 200B, and the light emitting elements 210 of the third light emitting element group 200C. That is, the partition wall 300A and the light emitting elements 210 are not in contact with each other.

Further, as shown in FIG. 1B, a height of the partition wall 300A is larger than a height of the green light emitting element 210G. Similarly, the height of the partition wall 300A is larger than heights of both the red light emitting element 210R and the blue light emitting element 210B. That is, the height of the partition wall 300A is larger than the height of the light emitting element 210. Since the height of the partition wall 300A is larger than the height of the light emitting element 210, light emitted in any direction from a side surface of the light emitting element 210 can be efficiently reflected by the partition wall 300A. Since the light reflected by the partition wall 300A is finally extracted from a direction of an upper surface of the light emitting element 210, light extraction efficiency from a front surface of the substrate 100 is improved. The height of the partition wall 300A may be 1.2 times or more than the height of the light emitting element 210, and may be 1.5 times or more or 2 times or more than the height of the light emitting element 210. However, if the height of the partition wall 300A is too large with respect to the height of the light emitting element 210, a diffused reflection between the partition walls 300A cause the light loss increase. As an example, the height of the light emitting element 210 is 100 µm, and the height of the partition wall 300A is 120 µm or more, more preferably 150 µm or more, and particularly preferably 200 µm or more.

A width of the linear portion of the partition wall 300A can be appropriately selected in consideration of a distance between the pixel regions 110 or a distance between the light emitting element groups 200.

Furthermore, the side surface of the partition wall 300A may not be provided perpendicularly (90 degrees) to the substrate 100. That is, the side surface of the partition wall 300A may be inclined so as to have a certain angle (taper angle) to the substrate 100. If the taper angle is too small, the width of the partition wall 300A is large, which makes the high definition of the display device difficult. Therefore, the taper angle is 60 degrees or more and 90 degrees or less, more preferably 70 degrees or more and 85 degrees or less, and particularly preferably 70 degrees or more and 80 degrees or less. In addition, the side surface of the partition wall 300A may be provided in a step shape.

Material

A light-transmitting substrate such as a glass substrate, a quartz substrate, a sapphire substrate, a polyimide substrate, an acrylic substrate, a siloxane substrate, or a fluororesin substrate can be used as a base material of the substrate 100. Further, when the substrate 100 does not need to have a light-transmitting property, a silicon substrate, a silicon carbide substrate, a semiconductor substrate such as a compound semiconductor substrate, or a conductive substrate such as a stainless substrate can be used.

A positive typed or negative typed photosensitive photoresist can be used as the material of the partition wall 300A. When the photosensitive photoresist is used, a thick film of partition wall 300A having a high aspect ratio can be formed over the substrate 100. An epoxy resin, a novolac resin, a phenol resin, or a mixture of these resins can be used as the photosensitive photoresist. A white pigment can also be used as the material of the partition wall 300A. For example, the materials described in Japanese laid-open patent publication No. 2019-46790 are known as the white pigment having a high light reflecting function and capable of fine patterning.

A method for manufacturing the partition wall 300A is described below.

First, a photosensitive photoresist film is formed over the substrate 100 by using a coating method, a printing method, an inkjet method, or the like. Next, the photosensitive photoresist film is exposed using a photomask so as to have a predetermined pattern. Finally, the partition wall 300A is formed by developing and etching the photosensitive photoresist film.

According to the display device 10A of this embodiment, by providing the partition wall 300A having the height larger than the height of the light emitting element 210 in the pixel region 110, the light emitted from the side surface of the light emitting element 210 is condensed in the direction of the front surface of the substrate 100. Therefore, the light extraction efficiency of the display surface of the display device 10A is improved. Further, since the partition wall 300A can absorb heat generated by the light emitting element 210 and radiate the heat, a temperature rise of the display device 10A can be suppressed.

Modification 1

Figure 2A:
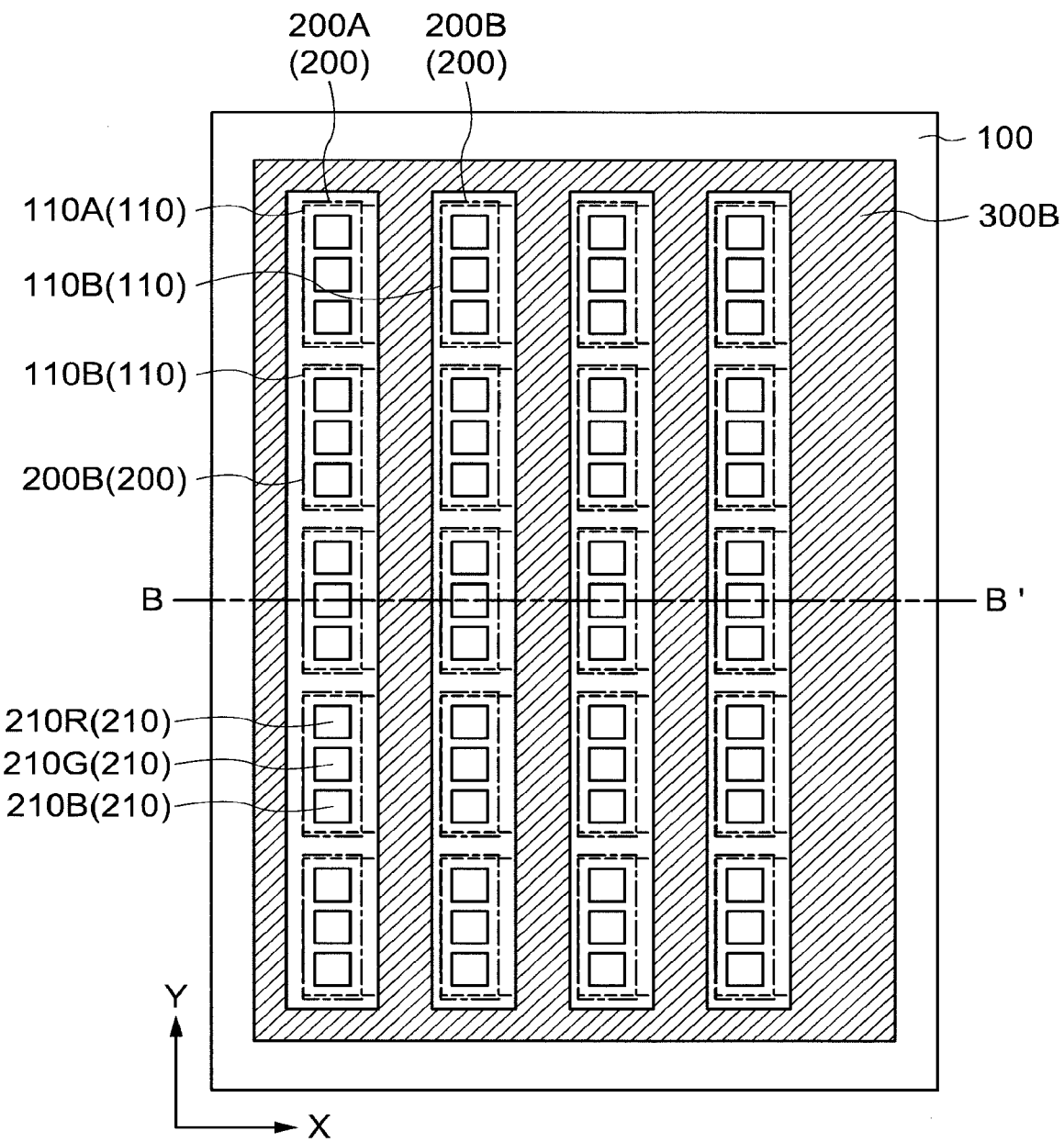
FIG. 2A is a schematic view (a plan view) of a display device according to an embodiment of the present invention.
Figure 2B:
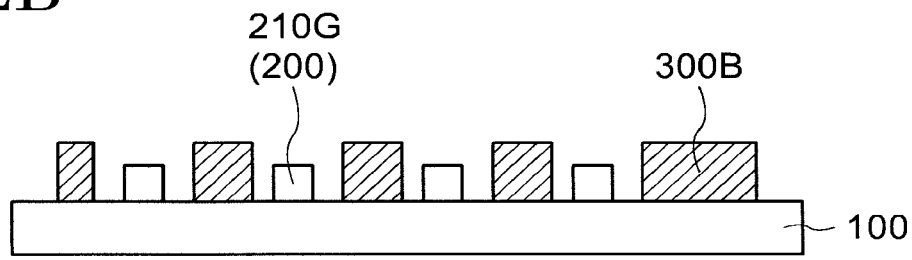
FIG. 2B is a schematic view (a cross-sectional view) of a display device according to an embodiment of the present invention.

Referring to FIGS. 2A and 2B, a display device 10B according to an embodiment, which is one of modifications of the display device 10A, is described. In the following, the description of the same configuration as the display device 10A is omitted, and the configuration different from that of the display device 10A is described.

FIGS. 2A and 2B are schematic views of the display device 10B according to an embodiment of the present invention. Specifically, FIG. 2A shows a plan view (a front view) of the display device 10B, and FIG. 2B shows a cross-sectional view of the display device 10B taken along the line B-B' of FIG. 2A.

As shown in FIG. 2A, the display device 10B includes the substrate 100, the light emitting element group 200, and a partition wall 300B.

The red light emitting element 210R, the green light emitting element 210G, and the blue light emitting element 210B included in the light emitting element group 200 of the display device 10B are arranged along one side of the pixel region 110. In other words, it can be said that the red light emitting element 210R, the green light emitting element 210G, and the blue light emitting element 210B are arranged in a stripe shape along one direction (Y direction) of the substrate 100.

The partition wall 300B includes a frame portion provided on the outer peripheral portion of the substrate 100 so as to surround the plurality of pixel regions 110 arranged in a matrix, and a linear portion provided in a stripe shape in the plurality of pixel regions 110. That is, the linear portion of the partition wall 300B is provided so as to linearly extend between the first light emitting element group 200A and the second light emitting element group 200B in the X direction perpendicular to the Y direction. Further, as shown in FIG. 2B, a height of the partition wall 300B is larger than the height of the light emitting element 210. Therefore, the light emitted in any direction from the side surface of the light emitting element 210 can be efficiently reflected by the partition wall 300B.

According to the display device 10B of the modification 1 of this embodiment, by providing the partition wall 300B having the height larger than the height of the light emitting element 210 in the pixel region 110, the light emitted from the side surface of the light emitting element 210 is condensed in the direction of the front surface of the substrate 100. Therefore, the light extraction efficiency of the display surface of the display device 10B is improved. Further, since the partition wall 300B can absorb the heat generated by the light emitting element 210 and radiate the heat, a temperature rise of the display device 10B can be suppressed.

Modification 2

Figure 3A:
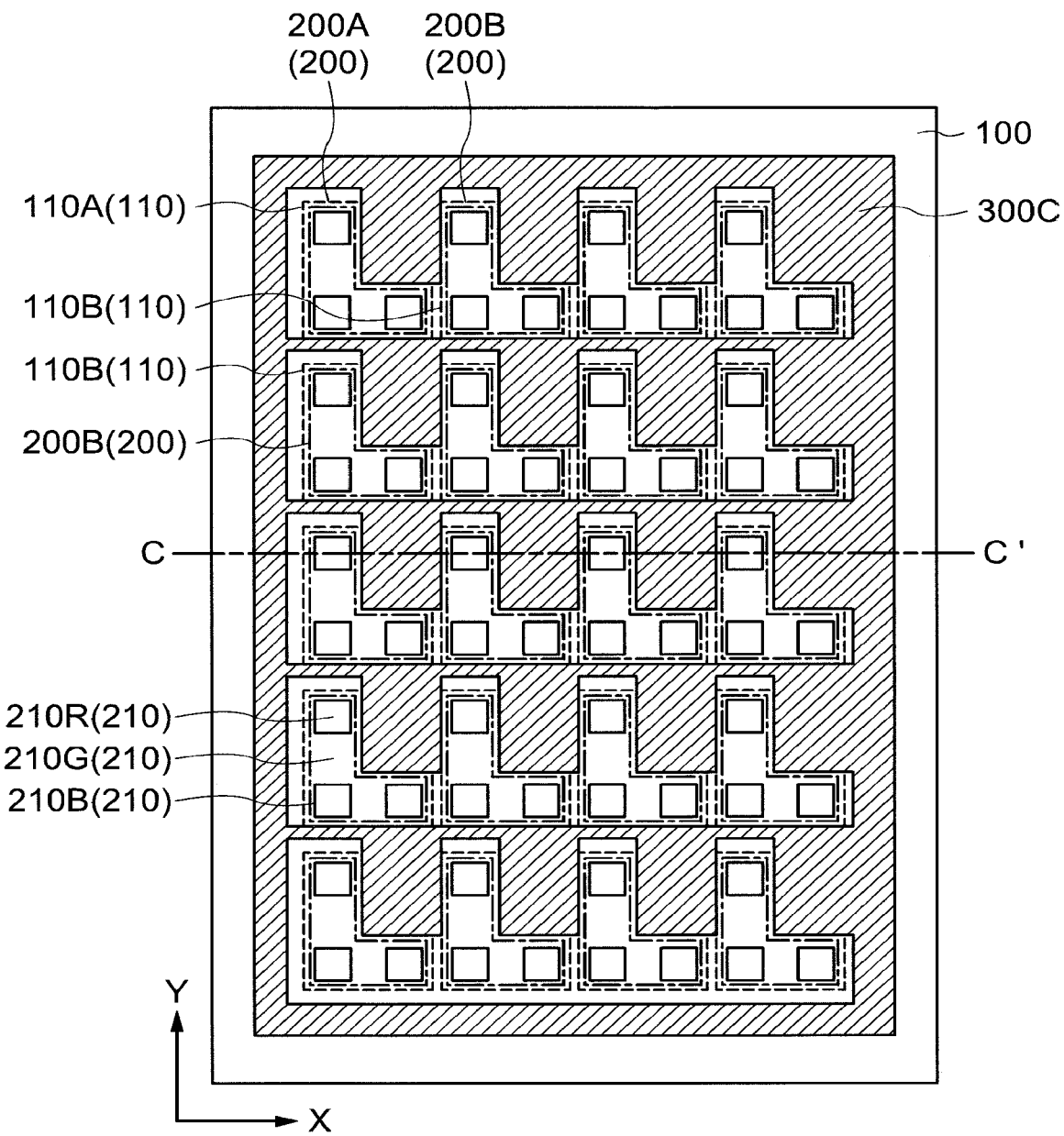
FIG. 3A is a schematic view (a plan view) of a display device according to an embodiment of the present invention.
Figure 3B:
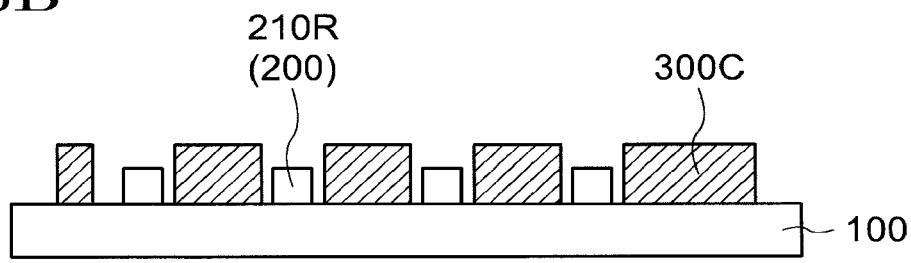
FIG. 3B is a schematic view (a cross-sectional view) of a display device according to an embodiment of the present invention.

Referring to FIGS. 3A and 3B, a display device 10C according to an embodiment of the present invention, which is one of modifications of the display device 10A, is described. In the following, the description of the same configuration as the display device 10A is omitted, and the configuration different from that of the display device 10A is described.

FIGS. 3A and 3B are schematic views of the display device 10C according to an embodiment of the present invention. Specifically, FIG. 3A shows a plan view (a front view) of the display device 10B, and FIG. 3B shows a cross-sectional view of the display device 10C taken along the line C-C' of FIG. 3A.

As shown in FIG. 3A, the display device 10C includes the substrate 100, the light emitting element group 200, and a partition wall 300C.

The red light emitting element 210R, the green light emitting element 210G, and the blue light emitting element 210B included in the light emitting element group 200 of the display device 10C are arranged at any one of the four corners of the pixel region 110. In other words, it can be said that the red light emitting element 210R, the green light emitting element 210G, and the blue light emitting element 210B are arranged in an L shape in the pixel region 110.

The partition wall 300C includes a frame portion provided on the outer peripheral portion of the substrate 100 so as to surround the plurality of pixel regions 110 arranged in a matrix, a linear portion extending in the X direction between pixel regions 110, and a rectangular portion protruding from the linear portion. Further, as shown in FIG. 3B, a height of the partition wall 300C is larger than the height of the light emitting element 210.

According to the display device 10C of the modification 2 of this embodiment, by providing the partition wall 300C having the height larger than the height of the light emitting element 210 in the pixel region 110, the light emitted from the side surface of the light emitting element 210 is condensed in the direction of the front surface of the substrate 100. Therefore, the light extraction efficiency of the display surface of the display device 10C is improved. Further, since the partition wall 300B can absorb the heat generated by the light emitting element 210 and radiate the heat, a temperature rise of the display device 10C can be suppressed.

Modification 3

Figure 4A:
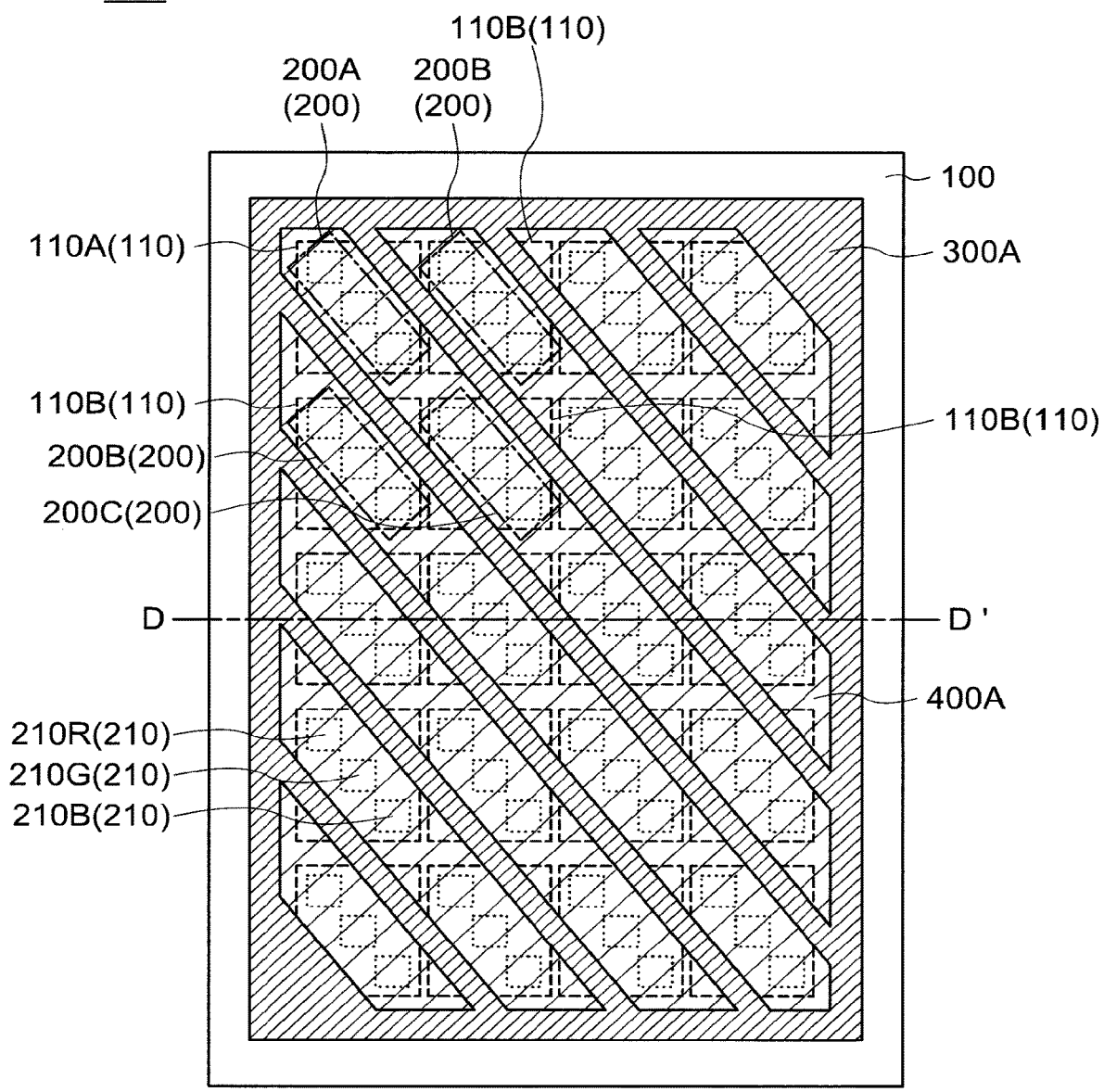
FIG. 4A is a schematic view (a plan view) of a display device according to an embodiment of the present invention.
Figure 4B:
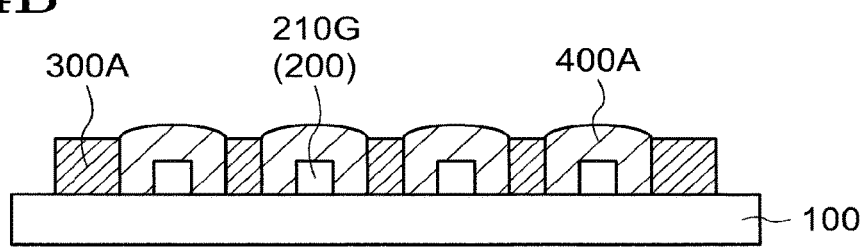
FIG. 4B is a schematic view (a cross-sectional view) of a display device according to an embodiment of the present invention.

Referring to FIGS. 4A and 4B, a display device 10D according to an embodiment, which is one of modifications of the display device 10A, is described. In the following, the description of the same configuration as the display device 10A is omitted, and the configuration different from that of the display device 10A is described.

FIGS. 4A and 4B are schematic views of the display device 10D according to an embodiment of the present invention. Specifically, FIG. 4A shows a plan view (a front view) of the display device 10D, and FIG. 2B shows a cross-sectional view of the display device 10D taken along the line D-D' of FIG. 4A.

As shown in FIG. 4A, the display device 10D includes the substrate 100, the light emitting element group 200, the partition wall 300A, and a transparent resin 400A.

The transparent resin 400A is filled in the opening portion in the partition wall 300A. That is, the light emitting element 210 of the display device 10D is in contact with the transparent resin 400A and is covered with the transparent resin 400A. Since the transparent resin 400A is in contact with the light emitting element 210, the heat generated by the light emitting element 210 is easily released, so that efficiency of heat radiation is increased. Further, since a refractive index of the transparent resin 400A is smaller than a refractive index of the partition 300A, the light emitted from the side surface of the light emitting element 210 can be efficiently reflected by the partition 300A.

In addition, as shown in FIG. 4B, the transparent resin 400A in the opening portion is provided such that a surface of the transparent resin 400A includes a convex portion. Since the light reaching the convex portion on the surface of the transparent resin 400A is diffused and emitted to the outside, a viewing angle dependency of the display device 10D can be reduced. Also, although the height of the partition wall 300A is larger than the height of the light emitting element 210, a height of the uppermost portion of the convex portion of the transparent resin 400A may be larger than the height of the partition wall 300A or may be smaller than the height of the partition wall 300A.

An acrylic resin or an epoxy resin can be used as a material of the transparent resin 400A. In particular, the transparent resin 400A is preferably a material having a refractive index larger than the refractive of the partition wall 300A.

According to the display device 10D of the modification 3 of this embodiment, by providing the partition wall 300A having the height larger than the height of the light emitting element 210 in the pixel region 110, the light emitted from the side surface of the light emitting element 210 is condensed in the direction of the front surface of the substrate 100. Therefore, the light extraction efficiency of the display surface of the display device 10D is improved. Further, since the partition wall 300A can absorb the heat generated by the light emitting element 210 and radiate the heat, a temperature rise of the display device 10D can be suppressed. Furthermore, since the surface of the transparent resin 400A includes the convex portion, the viewing angle dependence of the display device 10D can be reduced.

Modification 4

Figure 5A:
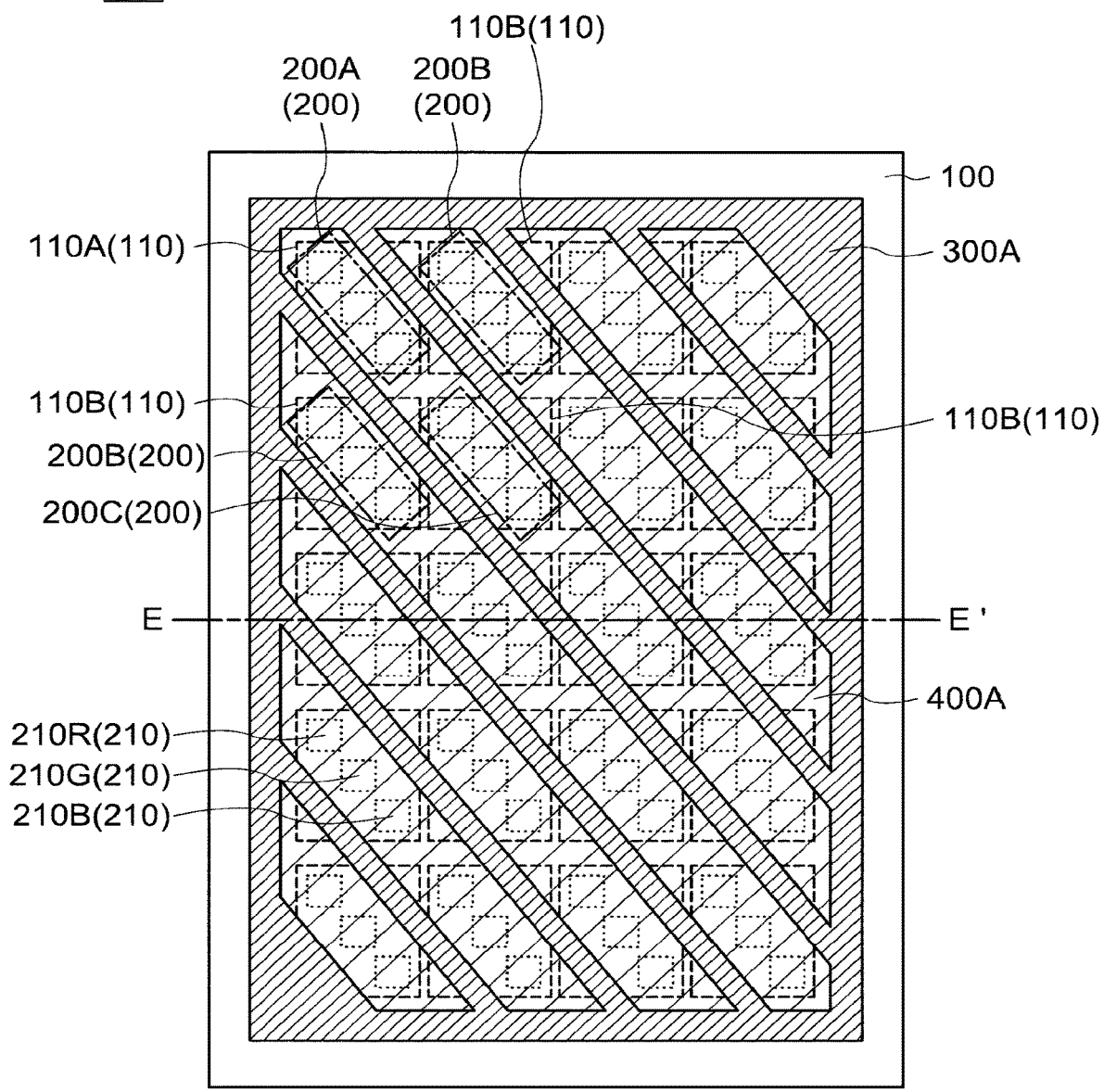
FIG. 5A is a schematic view (a plan view) of a display device according to an embodiment of the present invention.
Figure 5B:
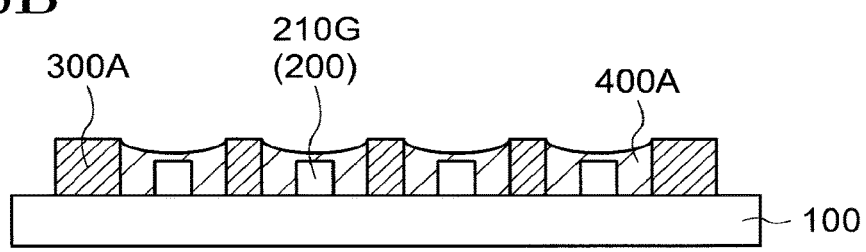
FIG. 5B is a schematic view (a cross-sectional view) of a display device according to an embodiment of the present invention.

Referring to FIGS. 5A and 5B, a display device 10E according to an embodiment of the present invention, which is one of modifications of the display device 10D, is described. In the following, the description of the same configuration as the display device 10D is omitted, and the configuration different from that of the display device 10D is described.

FIGS. 5A and 5B are schematic views of the display device 10E according to an embodiment of the present invention. Specifically, FIG. 5A shows a plan view (a front view) of the display device 10E, and FIG. 5B shows a cross-sectional view of the display device 10E taken along the line E-E' of FIG. 5A.

As shown in FIG. 5A, the display device 10E includes the substrate 100, the light emitting element group 200, the partition wall 300A, and a transparent resin 400B.

As shown in FIG. 5B, the transparent resin 400B in the opening portion of the partition wall 300A is provided such that a surface of the transparent resin 400B includes a concave portion. Since the light reaching the concave portion on the surface of the transparent resin 400B is diffused and emitted to the outside, luminous efficiency of the display device 10E is further increased. Also, although the height of the partition wall 300A is larger than the height of the light emitting element 210, a height of the lowermost part of the concave portion of the transparent resin 400B may be larger than the height of the light emitting element 210 or may be smaller than the height of the light emitting element 210.

According to the display device 10E of the modification 4 of this embodiment, by providing the partition wall 300A having the height larger than the height of the light emitting element 210 in the pixel region 110, the light emitted from the side surface of the light emitting element 210 is condensed in the direction of the front surface of the substrate 100. Therefore, the light extraction efficiency of the display surface of the display device 10E is improved. Further, since the partition wall 300A can absorb the heat generated by the light emitting element 210 and radiate the heat, a temperature rise of the display device 10E can be suppressed. Furthermore, since the surface of the transparent resin 400B includes concave portion, the luminous efficiency of the display device 10E is further increased.

Modification 5

Figure 6A:
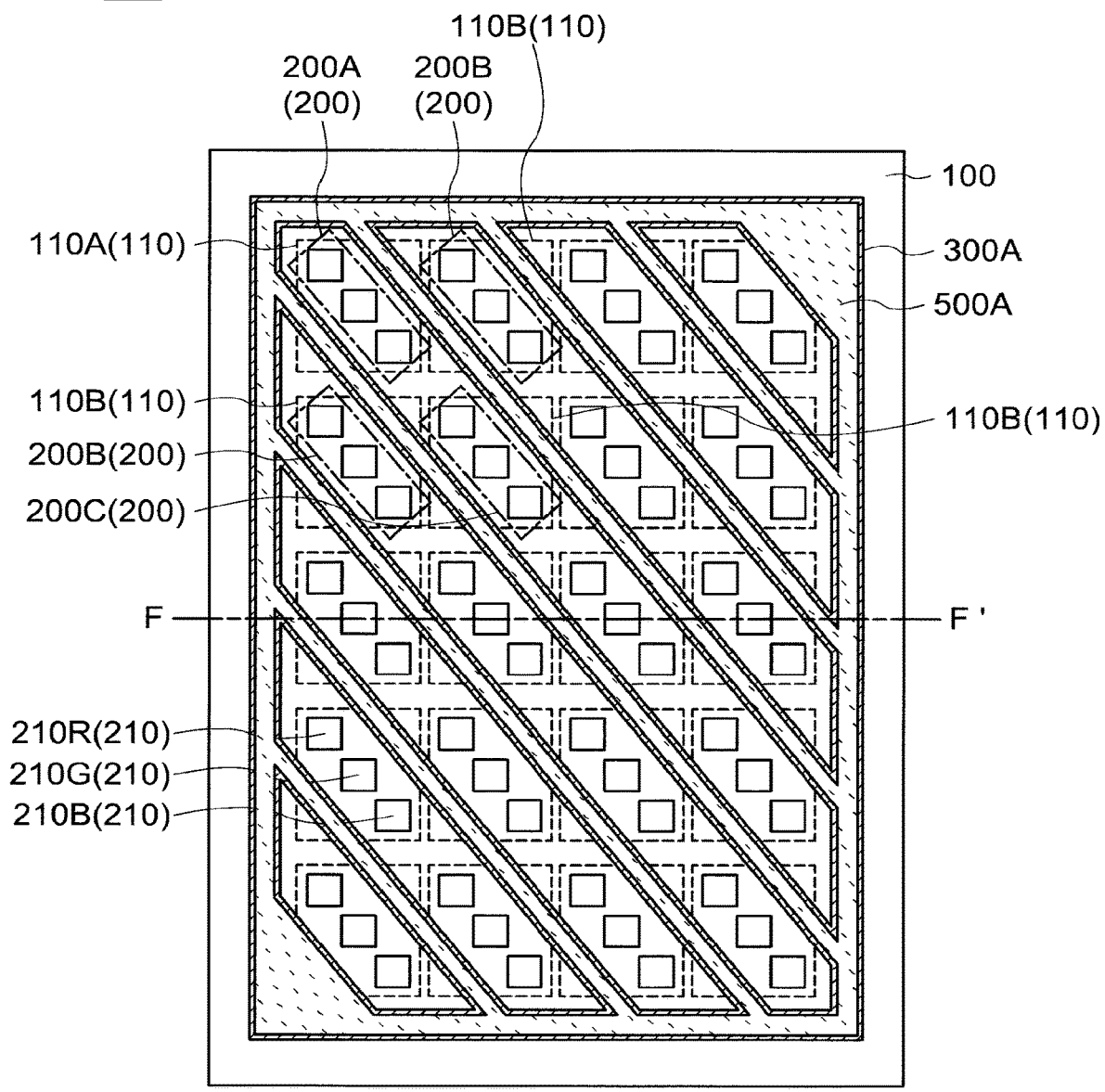
FIG. 6A is a schematic view (a plan view) of a display device according to an embodiment of the present invention.
Figure 6B:
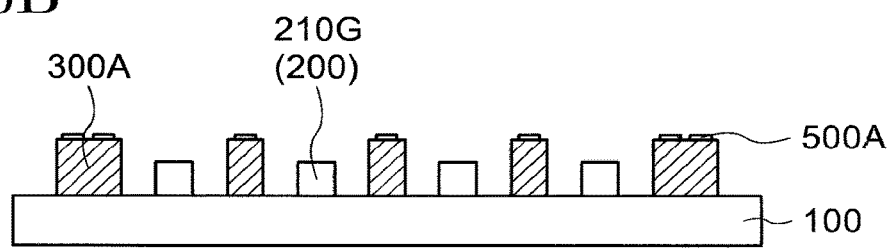
FIG. 6B is a schematic view (a cross-sectional view) of a display device according to an embodiment of the present invention.

Referring to FIGS. 6A and 6B, a display device 10F according to an embodiment of the present invention, which is one of modifications of the display device 10A, is described. In the following, the description of the same configuration as the display device 10A is omitted, and the configuration different from that of the display device 10A is described.

FIGS. 6A and 6B are schematic views of the display device 10F according to an embodiment of the present invention. Specifically, FIG. 6A shows a plan view (a front view) of the display device 10F, and FIG. 6B shows a cross-sectional view of the display device 10F taken along the line F-F' of FIG. 6A.

As shown in FIG. 6A, the display device 10F includes the substrate 100, the light emitting element group 200, the partition wall 300A, and a metal film 500A.

The metal film 500A is provided on at least a part of the upper surface of the partition wall 300A. Since the metal film 500A having high thermal conductivity is in contact with the partition wall 300A, the heat generated by the light emitting element 210 is easily released, so that the efficiency of heat radiation is improved. The film thickness of the metal film 500A can be appropriately determined.

Gold, silver, copper, aluminum, tungsten, molybdenum, iron, an alloy thereof, or the like can be used as a material of the metal film 500A.

The height of the partition wall 300A is larger than that of the light emitting element 210. Even if the height of the partition wall 300A is smaller than the height of the light emitting element 210, a total height of the partition wall 300A and the metal film 500A may be larger than the height of the light emitting element 210. In that case, a side surface of the metal film 500A can reflect the light emitted from the light emitting element 210.

According to the display device 10F of the modification 5 of this embodiment, by providing the partition wall 300A having the height larger than the height of the light emitting element 210 in the pixel region 110 or the partition wall 300A and the metal film 500A having the total height larger than the height of the light emitting element 210 in the pixel region, the light emitted from the side surface of the light emitting element 210 is condensed in the direction of the front surface of the substrate 100. Therefore, the light extraction efficiency of the display surface of the display device 10F is improved. Further, since the partition wall 300A and the metal film 500A can absorb the heat generated by the light emitting element 210 and radiate the heat, a temperature rise of the display device 10F can be suppressed.

Modification 6

Figure 7A:
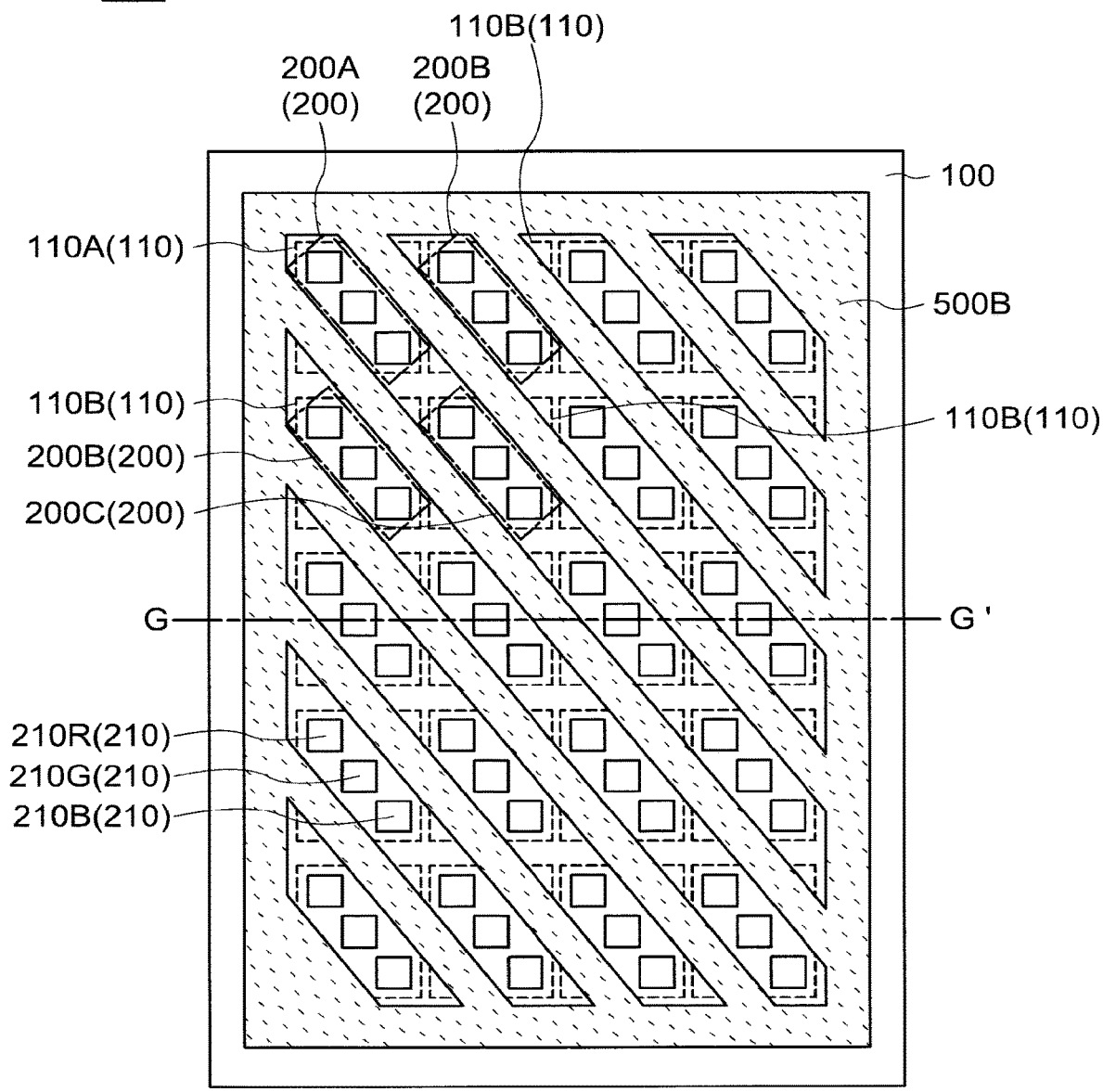
FIG. 7A is a schematic view (a plan view) of a display device according to an embodiment of the present invention.
Figure 7B:
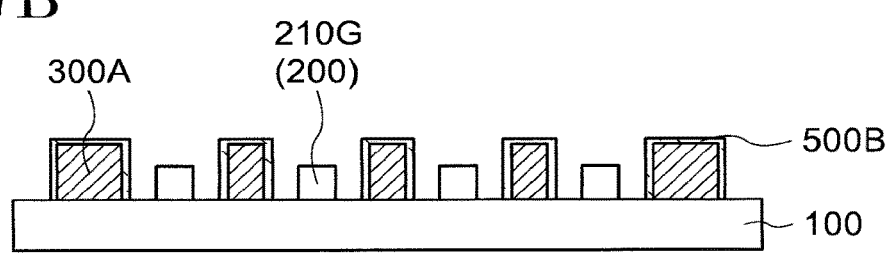
FIG. 7B is a schematic view (a cross-sectional view) of a display device according to an embodiment of the present invention.

Referring to FIGS. 7A and 7B, a display device 10G according to an embodiment of the present invention, which is one of modifications of the display device 10F, is described. In the following, the description of the same configuration as the display device 10F is omitted, and the configuration different from that of the display device 10F is described.

FIGS. 7A and 7B are schematic views of the display device 10G according to an embodiment of the present invention. Specifically, FIG. 7A shows a plan view (a front view) of the display device 10G, and FIG. 7B shows a cross-sectional view of the display device 10G taken along the line G-G' of FIG. 7A.

As shown in FIG. 7A, the display device 10G includes the substrate 100, the light emitting element group 200, the partition wall 300A, and a metal film 500B.

The metal film 500B is provided on at least a part of the upper surface and a part of the side surface of the partition wall 300A. Since the metal film 500A having high thermal conductivity is in contact with the partition wall 300A, the heat generated by the light emitting element 210 is easily released, so that the efficiency of heat radiation is improved. In particular, since the metal film 500B is provided on the side surface of the partition wall 300A, a surface area of the metal film 500B is larger than the surface area of the metal film 500A of the Modification 5. Therefore, the efficiency of heat radiation is further improved. Further, the metal film 500B provided on the side surface of the partition wall 300A can efficiently reflect the light emitted from the side surface of the light emitting element 210.

The metal film 500B can use the same material as the metal film 500A. Further, the metal film 500B preferably has a film thickness that does not transmit light.

The height of the partition wall 300A is larger than the height of the light emitting element 210. Even if the height of the partition 300A is smaller than the height of the light emitting element 210, a total height of the partition 300A and the metal film 500B may be larger than the height of the light emitting element 210.

According to the display device 10G of the modification 6 of this embodiment, by providing the partition wall 300A having the height larger than the height of the light emitting element 210 in the pixel region 110 or the partition wall 300A and the metal film 500B having the total height larger than the height of the light emitting element 210 in the pixel region, the light emitted from the side surface of the light emitting element 210 is condensed in the direction of the front surface of the substrate 100. Therefore, the light extraction efficiency of the display surface of the display device 10G is improved. Further, since the partition wall 300A and the metal film 500B can absorb the heat generated by the light emitting element 210 and radiate the heat, a temperature rise of the display device 10G can be suppressed.

Modification 7

Figure 8A:
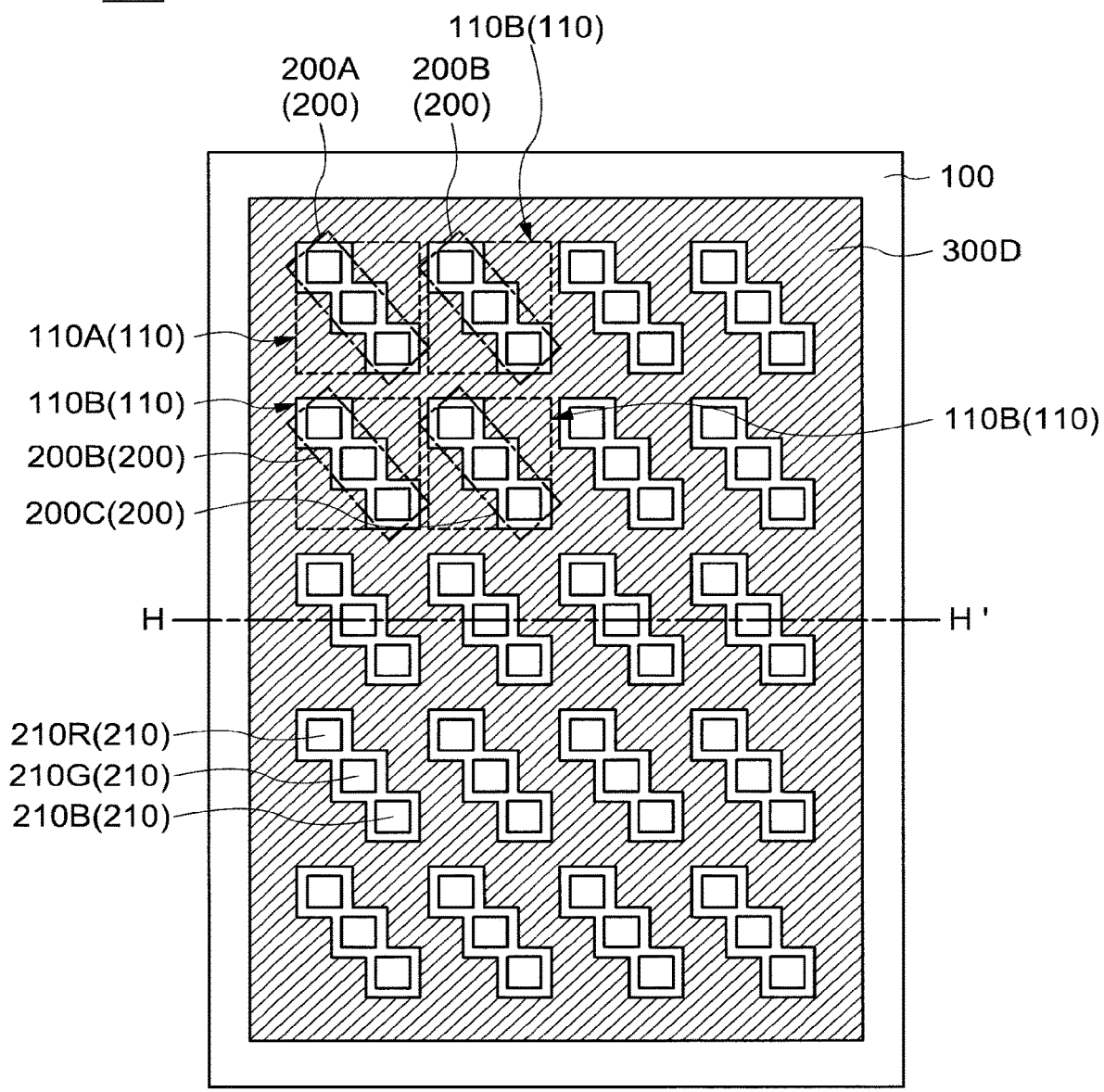
FIG. 8A is a schematic view (a plan view) of a display device according to an embodiment of the present invention.
Figure 8B:
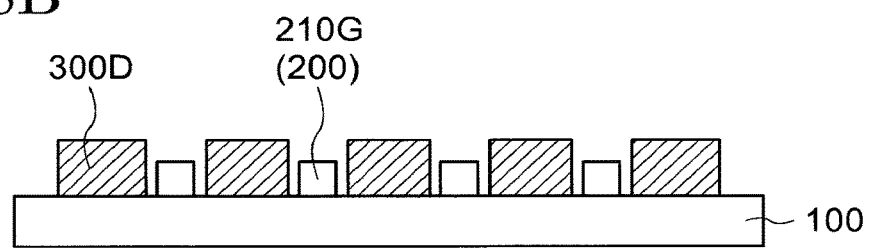
FIG. 8B is a schematic view (a cross-sectional view) of a display device according to an embodiment of the present invention.

Referring to FIGS. 8A and 8B, a display device 10H according to an embodiment of the invention, which is one of modifications of the display device 10A, is described. In the following, the description of the same configuration as the display device 10A is omitted, and the configuration different from that of the display device 10A is described.

FIGS. 8A and 8B are schematic views of the display device 10H according to an embodiment of the present invention. Specifically, FIG. 8A shows a plan view (a front view) of the display device 10H, and FIG. 8B shows a cross-sectional view of the display device 10H taken along the line H-H' of FIG. 8A.

As shown in FIG. 8A, the display device 10H includes the substrate 100, the light emitting element group 200, and a partition wall 300D.

The partition wall 300D is provided along the red light emitting element 210R, the green light emitting element 210G, and the blue light emitting element 210B so as to surround the red light emitting element 210R, the green light emitting element 210G, and the blue light emitting element 210B in the pixel region 110. That is, the partition wall 300D includes a portion provided along at least two side surfaces of one of the plurality of light emitting elements 210. In other words, it can be said that the partition wall 300D is opened so as to surround the light emitting element 210. The partition wall 300D does not necessarily need to have one opening portion for one light emitting element 210. One opening portion for the plurality of light emitting elements 210 may be provided. Further, as shown in FIG. 8B, a height of the partition wall 300D is larger than the height of the light emitting element 210.

According to the display device 10H of the modification 7 of this embodiment, by providing the partition wall 300D having the height larger than the height of the light emitting element 210 in the pixel region 110, the light emitted from the side surface of the light emitting element 210 is condensed in the direction of the front surface of the substrate 100. Therefore, the light extraction efficiency of the display surface of the display device 10H is improved. Further, since the partition wall 300D can absorb the heat generated by the light emitting element 210 and radiate the heat, a temperature rise of the display device 10H can be suppressed.

Modification 8

Figure 9A:
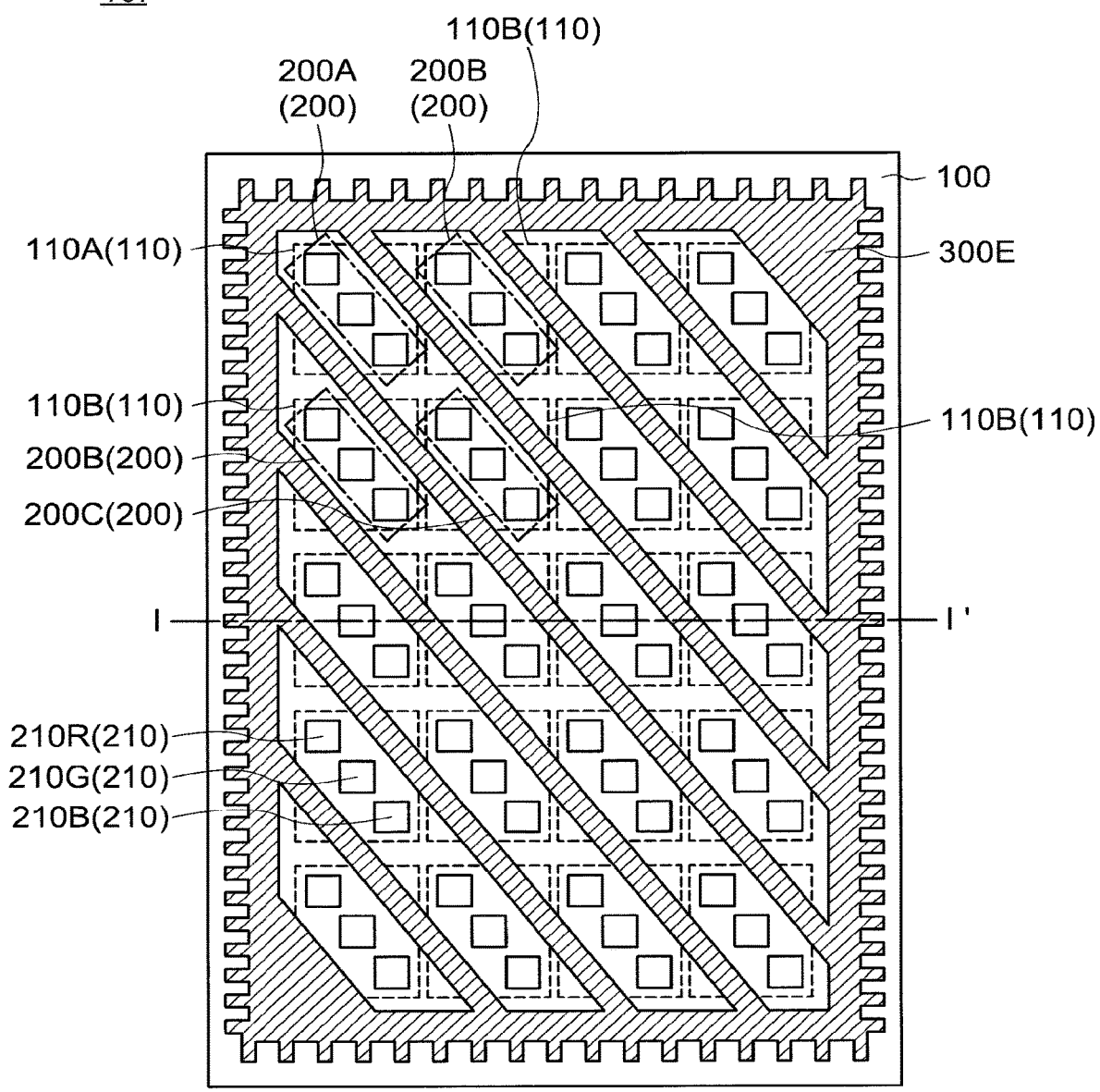
FIG. 9A is a schematic view (a plan view) of a display device according to an embodiment of the present invention.
Figure 9B:
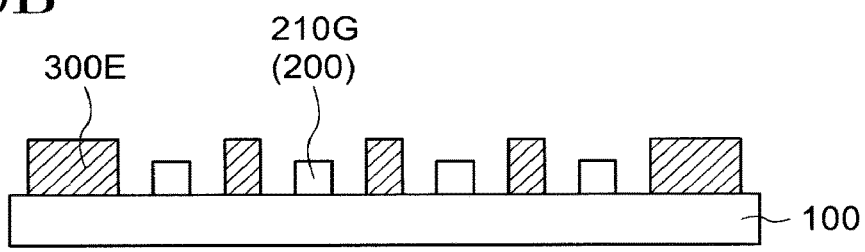
FIG. 9B is a schematic view (a cross-sectional view) of a display device according to an embodiment of the present invention.

Referring to FIGS. 9A and 9B, a display device 10I according to an embodiment of the present invention, which is one of modifications of the display device 10I, is described. In the following, the description of the same configuration as the display device 10A is omitted, and the configuration different from that of the display device 10A is described.

FIGS. 9A and 9B are schematic views of the display device 10I according to an embodiment of the present invention. Specifically, FIG. 9A shows a plan view (a front view) of the display device 10I, and FIG. 9B shows a cross-sectional view of the display device 10I taken along the line I-I' of FIG. 9A.

As shown in FIG. 9A, the display device 10I includes the substrate 100, the light emitting element group 200, and a partition wall 300E. Further, as shown in FIG. 9B, a height of the partition wall 300E is larger than the height of the light emitting element 210.

The partition wall 300E includes a frame portion including a portion protruding toward the outer peripheral direction of the substrate 100 and a portion recessed inside the substrate 100. In other words, it can be said that the frame portion (an outer peripheral portion) of the partition wall 300E is provided in a comb shape. Since the frame portion of the partition wall 300E is provided in the comb shape, a surface area of the partition wall 300E is increased, so that the heat generated by the light emitting element 210 can be efficiently radiate.

According to the display device 10I of the modification 8 of this embodiment, by providing the partition wall 300E having the height larger than the height of the light emitting element 210 in the pixel region 110, the light emitted from the side surface of the light emitting element 210 is condensed in the direction of the front surface of the substrate 100. Therefore, the light extraction efficiency of the display surface of the display device 10I is improved. Further, since the partition wall 300E can absorb the heat generated by the light emitting element 210 and radiate the heat, a temperature rise of the display device 10I can be suppressed. In particular, since the surface area of the partition wall 300E is increased in the outer peripheral portion of the substrate 100 in the display device 10I, the heat can be efficiently radiated.

Modification 9

Figure 10A:
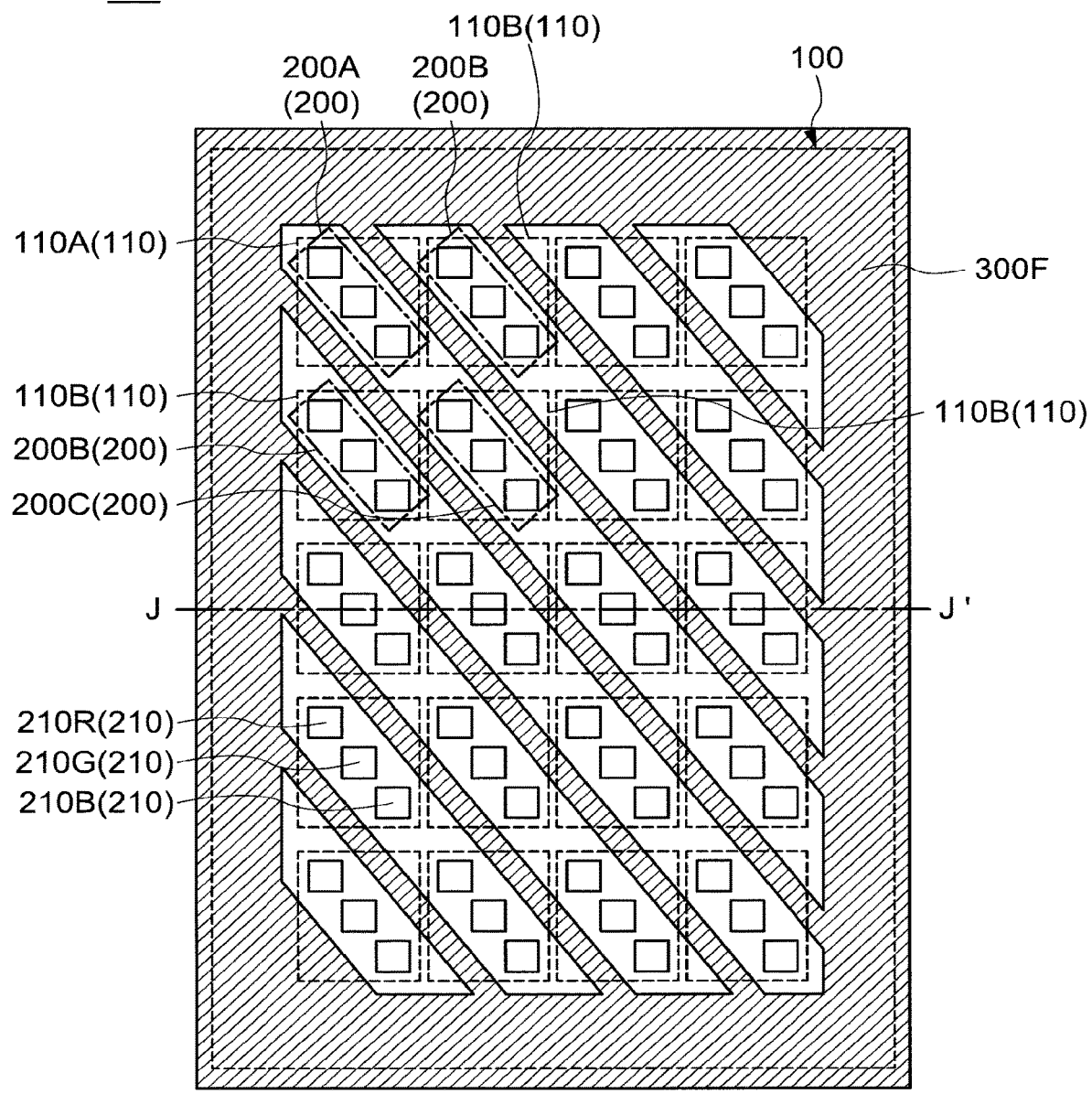
FIG. 10A is a schematic view (a plan view) of a display device according to an embodiment of the present invention.
Figure 10B:
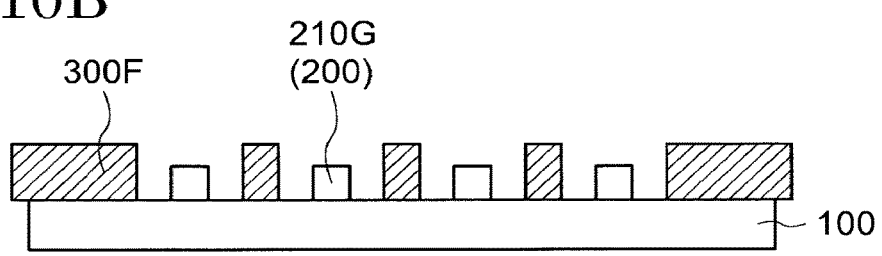
FIG. 10B is a schematic view (a cross-sectional view) of a display device according to an embodiment of the present invention.

Referring to FIGS. 10A and 10B, a display device 10J according to an embodiment of the present invention, which is one of modifications of the display device 10A, is described. In the following, the description of the same configuration as the display device 10A is omitted, and the configuration different from that of the display device 10A is described.

FIGS. 10A and 10B are schematic views of the display device 10J according to an embodiment of the present invention. Specifically, FIG. 10A shows a plan view (a front view) of the display device 10J, and FIG. 10B shows a cross-sectional view of the display device 10J taken along the line J-J' of FIG. 10A.

As shown in FIG. 10A, the display device 10J includes the substrate 100, the light emitting element group 200, and a partition wall 300F. Further, as shown in FIG. 10B, a height of the partition wall 300F is larger than the height of the light emitting element 210.

The partition wall 300E includes a frame portion protruding from an edge portion of the substrate 100 to outside. Therefore, a surface area of the partition wall 300F is increased outside the substrate 100, so that the heat generated by the light emitting element 210 can be efficiently radiated.

According to the display device 10J of the modification 9 of this embodiment, by providing the partition wall 300F having the height larger than the height of the light emitting element 210 in the pixel region 110, the light emitted from the side surface of the light emitting element 210 is condensed in the direction of the front surface of the substrate 100. Therefore, the light extraction efficiency of the display surface of the display device 10J is improved. Further, since the partition wall 300F can absorb the heat generated by the light emitting element 210 and radiate the heat, a temperature rise of the display device 10J can be suppressed. In particular, since the surface area of the partition wall 300F is increased in the outer peripheral portion of the substrate 100 in the display device 10J, the heat can be efficiently radiated.

The First Embodiment including the Modifications is merely one embodiment, and the present invention is not limited to the configurations of the First Embodiment.

Second Embodiment

Figure 11A:
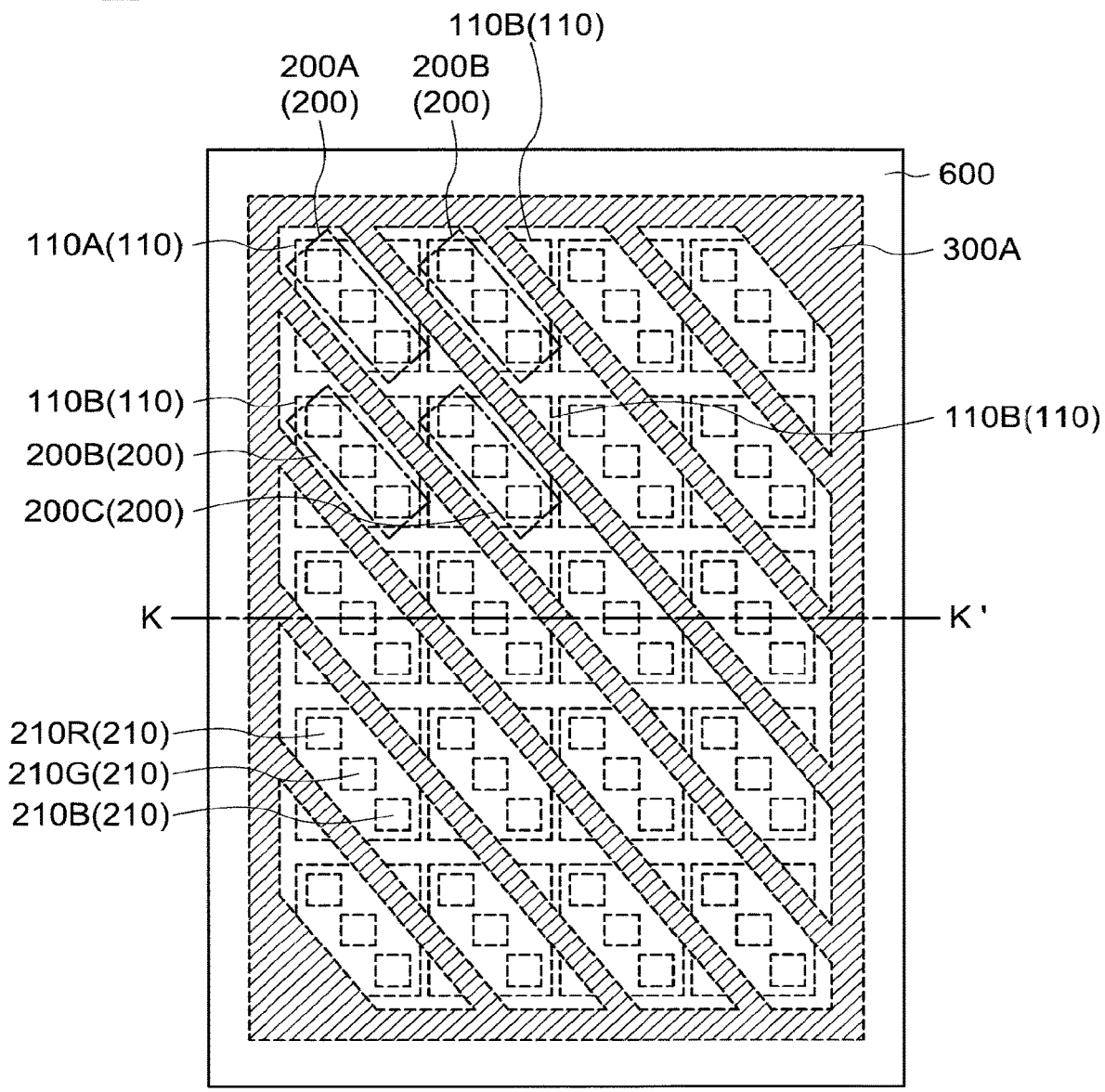
FIG. 11A is a schematic view (a plan view) of a display device according to an embodiment of the present invention.
Figure 11B:
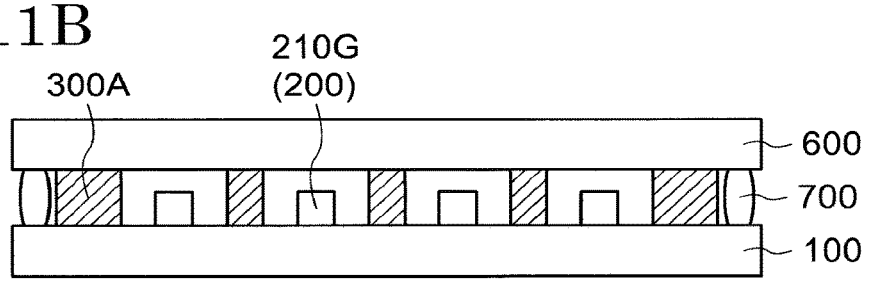
FIG. 11B is a schematic view (a cross-sectional view) of a display device according to an embodiment of the present invention.

Referring to FIGS. 11A and 11B, a display device 20 according to an embodiment of the present invention. In the following, the description of the same configuration as the display device 10A according to the First Embodiment is omitted, and the configuration different from that of the display device 10A is described.

FIGS. 11A and 11B are schematic views of the display device 20 according to an embodiment of the present invention. Specifically, FIG. 11A shows a plan view (a front view) of the display device 20, and FIG. 11B shows a cross-sectional view of the display device 20 taken along the line K-K' of FIG. 11A.

As shown in FIGS. 11A and 11B, the display device 20 includes a first substrate 100A, the light emitting element group 200, the partition wall 300A, a second substrate 600, and an adhesive portion 700.

The first substrate 100A corresponds to the substrate 100 of the First Embodiment. That is, the first substrate 100A functions not only to support the light emitting element 210 but also to drive the light emitting element 210. The first substrate 100A may be the same base material as the the substrate 100.

On the other hand, the second substrate 600 functions to protect the light emitting device 210 from external impact. Since the light emitted from the light emitting element 210 is extracted through the second substrate 600, the second substrate 600 needs to have light-transmitting property. Therefore, the second substrate 600 can use a light-transmitting base material among the base materials used as the substrate 100. For example, a light-transmitting substrate such as a glass substrate, a quartz substrate, a sapphire substrate, a polyimide substrate, an acrylic substrate, a siloxane substrate, or a fluororesin substrate can be used as the second substrate 600.

The first substrate 100A and the second substrate 600 are bonded through the bonding portion 700. A UV curable adhesive or a thermosetting adhesive can be used for the adhesive portion 700. Further, an epoxy adhesive can be used as the adhesive.

The partition wall 300A includes the frame portion provided on the outer peripheral portion of the substrate 100 so as to surround the plurality of pixel regions 110 arranged in a matrix, and the linear portion provided in a stripe shape in the plurality of pixel regions 110. That is, the linear portion of the partition wall 300A is provided so as to linearly extend between the first light emitting element group 200A and the second light emitting element group 200B and between the second light emitting element group 200B and the third light emitting element group 200C. Further, the height of the partition wall 300A is larger than the height of the light emitting element 210.

In addition, the partition wall 300A is located between the first substrate 100A and the second substrate 600 and is in contact with the first substrate 100A and the second substrate 600. Therefore, in the display device 20, the partition wall 300A also functions as a spacer that holds a gap between the first substrate 100A and the second substrate 600.

In the display device 20, the partition wall 300A can be formed not only over the first substrate 100A but also over the second substrate 600. In the case that the partition wall 300A is formed over the first substrate 100A, the adhesive is coated on the first substrate 100A or the second substrate 600 and the first substrate 100A and the second substrate 600 are attached to each other. On the other hand, in the case that the partition wall 300A is formed over the second substrate 600, alignment markers are formed on the first substrate 100A and the second substrate 600 in advance. The adhesive is coated on the first substrate 100A or the second substrate 600 and the first substrate 100A and the second substrate 600 are attached to each other using the alignment markers.

In addition, a resin or an adhesive may be filled in the gap between the first substrate 100A and the second substrate 600.

According to the display device 20, by providing the partition wall 300A having the height larger than the height of the light emitting element 210 in the pixel region 110, the light emitted from the side surface of the light emitting element 210 is condensed in the direction of the front surface of the substrate 100. Therefore, the light extraction efficiency of the display surface of the display device 20 is improved. Further, since the partition wall 300A can absorb the heat generated by the light emitting element 210 and radiate the heat, a temperature rise of the display device 20 can be suppressed. Furthermore, since the second substrate 600 protects the light emitting element 210, the display device 20 is durable to external impact.

Each embodiment described above as embodiments of the present invention can be implemented in combination as appropriate as long as they do not contradict each other. In addition, those skilled in the art could appropriately add, delete or change the design of the constituent elements based on the display device of each embodiment, or add, omit or change conditions as long as it does not depart from the concept of the present invention and such changes are included within the scope of the present invention.

Even if other actions and effects different from the actions and effects brought about by the aspects of each embodiment described above are obvious from the description of the present specification or those which could be easily predicted by those skilled in the art, such actions and effects are to be interpreted as being provided by the present invention.

What is claimed is:

1. A display device comprising:
   a substrate;
   a first pixel region comprising a first light emitting element group over the substrate;
   a second pixel region comprising a second light emitting element group over the substrate and adjacent to the first light emitting element group; and
   a partition wall between the first light emitting element group and the second light emitting element, wherein
   a height of the partition wall is larger than heights of a plurality of light emitting elements included in each of the first light emitting element group and the second light emitting element group,
   the partition wall comprises:
      a frame portion along an outer periphery of the substrate, and a linear portion extending from a first side of the frame portion to a second side of the frame portion inside the frame portion, and the first side is orthogonal to the second side.

2. The display device according to claim 1, wherein the plurality of emitting elements comprises a red light emitting element, a green light emitting element, and a blue light emitting element.

3. The display device according to claim 2, wherein the partition wall comprises a portion provided along the red light emitting element, the green light emitting element, and the blue light emitting element.

4. The display device according to claim 1, wherein the partition wall comprises a linear portion provided in a stripe shape with respect to the substrate.

5. The display device according to claim 1, wherein the partition wall comprises a portion provided along at least two side surfaces of one of the plurality of light emitting elements.

6. The display device according to claim 1, wherein the partition wall comprises a taper.

7. The display device according to claim 1, wherein a side surface of the partition wall comprises a step.

8. The display device according to claim 1, wherein a metal film is provided over at least a part of a side surface of the partition wall.

9. The display device according to claim 1, wherein a metal film is provided over at least a part of a top surface of the partition wall.

10. The display device according to claim 1, wherein the first light emitting element group and the second light emitting element group are covered with a transparent resin.

11. The display device according to claim 10, wherein the transparent resin comprises a convex portion.

12. The display device according to claim 10, wherein the transparent resin comprises a concave portion.

13. A display device comprising:

a substrate;

a first pixel region comprising a first light emitting element group over the substrate;

a second pixel region comprising a second light emitting element group over the substrate and adjacent to the first light emitting element group; and a partition wall between the first light emitting element group and the second light emitting element, wherein a height of the partition wall is larger than heights of a plurality of light emitting elements included in each of the first light emitting element group and the second light emitting element group, and an outer periphery of the partition wall comprises a portion in a comb shape.

14. A display device comprising:

a substrate;

a first pixel region comprising a first light emitting element group over the substrate;

a second pixel region comprising a second light emitting element group over the substrate and adjacent to the first light emitting element group; and a partition wall between the first light emitting element group and the second light emitting element, wherein a height of the partition wall is larger than heights of a plurality of light emitting elements included in each of the first light emitting element group and the second light emitting element group, and an outer periphery of the partition wall is positioned outside the substrate.

\* \* \* \* \*